US008860690B2

(12) United States Patent
Trend et al.

(10) Patent No.: US 8,860,690 B2
(45) Date of Patent: Oct. 14, 2014

(54) TOUCH SENSOR WITH CAPACITIVE NODES HAVING A CAPACITANCE THAT IS APPROXIMATELY THE SAME

(75) Inventors: Matthew Trend, Fareham (GB); Paul Clements, Whiteley (GB)

(73) Assignee: Atmel Corporation, San Jose, CA (US)

( * ) Notice: Subject to any disclaimer, the term of this patent is extended or adjusted under 35 U.S.C. 154(b) by 325 days.

(21) Appl. No.: 13/327,381

(22) Filed: Dec. 15, 2011

(65) Prior Publication Data

US 2013/0154995 A1 Jun. 20, 2013

(51) Int. Cl.
G06F 3/045 (2006.01)
G06F 3/044 (2006.01)

(52) U.S. Cl.
CPC ...... *G06F 3/044* (2013.01); *G06F 2203/04111* (2013.01)
USPC .......................................... 345/174

(58) Field of Classification Search
None
See application file for complete search history.

(56) References Cited

U.S. PATENT DOCUMENTS

| | | | |
|---|---|---|---|
| 6,297,811 B1 | 10/2001 | Kent et al. | |
| 7,589,713 B2 * | 9/2009 | Sato .............................. | 345/169 |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 2003/0076308 A1 | 4/2003 | Sano et al. | |
| 2006/0097991 A1 | 5/2006 | Hotelling et al. | |
| 2008/0158178 A1 | 7/2008 | Hotelling et al. | |
| 2008/0309635 A1 | 12/2008 | Matsuo | |
| 2009/0315854 A1 | 12/2009 | Matsuo | |
| 2010/0007628 A1 | 1/2010 | Eriguchi et al. | |
| 2010/0044122 A1* | 2/2010 | Sleeman et al. ........... | 178/18.06 |
| 2010/0045632 A1* | 2/2010 | Yilmaz et al. ................. | 345/174 |

(Continued)

FOREIGN PATENT DOCUMENTS

WO WO 2012/129247 9/2012

OTHER PUBLICATIONS

Patent Application entitled, "*Touchscreen Electrode Configuration*", inventor(s) Harald Philipp; specification, claims, abstract, drawings; (29 pgs), filed Oct. 29, 2009.
U.S. Appl. No. 61/454,936, filed Mar. 21, 2011, Myers.

(Continued)

*Primary Examiner* — Jason Olson
(74) *Attorney, Agent, or Firm* — Baker Botts LLP

(57) ABSTRACT

According to one embodiment, a touch sensor has a first edge and a second edge approximately perpendicular to the first edge. The touch sensor includes a first plurality of electrodes approximately parallel to the first edge, and a second plurality of electrodes. Each of the second plurality of electrodes has a spine that is approximately parallel to the second edge and a plurality of conductive elements that are approximately parallel to the first edge and in physical contact with the spine. At least one electrode of the second plurality of electrodes is adjacent to the second edge. The touch sensor further includes a plurality of nodes. Each node is formed by a capacitive coupling between an electrode of the first plurality of electrodes and an electrode of the second plurality of electrodes. The capacitance of each node is approximately the same.

16 Claims, 9 Drawing Sheets

(56) References Cited

U.S. PATENT DOCUMENTS

| 2010/0085326 | A1 | 4/2010 | Anno |
| 2010/0252335 | A1 | 10/2010 | Orsley |
| 2011/0018557 | A1 | 1/2011 | Badaye |
| 2011/0095990 | A1 | 4/2011 | Philipp et al. |
| 2011/0096015 | A1* | 4/2011 | Yilmaz .......................... 345/174 |
| 2011/0096016 | A1* | 4/2011 | Yilmaz .......................... 345/174 |
| 2012/0242588 | A1 | 9/2012 | Myers |
| 2012/0242592 | A1 | 9/2012 | Rothkopf |
| 2012/0243151 | A1 | 9/2012 | Lynch |
| 2012/0243719 | A1 | 9/2012 | Franklin |
| 2013/0076612 | A1 | 3/2013 | Myers |

OTHER PUBLICATIONS

U.S. Appl. No. 61/454,950, filed Mar. 21, 2011, Lynch.

U.S. Appl. No. 61/454,894, filed Mar. 21, 2011, Rothkopf.

E. Yilmaz, U.S. Appl. No. 12/605,779, Requirement for Restriction Election, Oct. 12, 2012.

E. Yilmaz, U.S. Appl. No. 12/605,779, Response to Requirement for Restriction Election, Dec. 12, 2012.

E. Yilmaz, U.S. Appl. No. 12/605,779, Non-Final Rejection, Feb. 25, 2013.

E. Yilmaz, U.S. Appl. No. 12/605,779, Response to Non-Final Rejection, Jul. 25, 2013.

E. Yilmaz, U.S. Appl. No. 12/605,779, Final Rejection, Nov. 29, 2013.

E. Yilmaz, U.S. Appl. No. 12/605,779, Applicant Initiated Interview Summary, Dec. 30, 2013.

E. Yilmaz, U.S. Appl. No. 12/605,779, Examiner's Initiated Interview Summary, Feb. 5, 2014.

E. Yilmaz, U.S. Appl. No. 12/605,779, Appeal Brief, Jun. 30, 2014.

* cited by examiner

TOUCH SENSOR WITH CAPACITIVE NODES HAVING A CAPACITANCE THAT IS APPROXIMATELY THE SAME

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

Touch sensors typically include an electrode pattern, such as one of the electrode patterns included in the touch sensors illustrated in FIGS. 1E-1H. Touch sensors with these typical electrode patterns, however, may be deficient.

DESCRIPTION OF EXAMPLE EMBODIMENTS

Figure 1A:
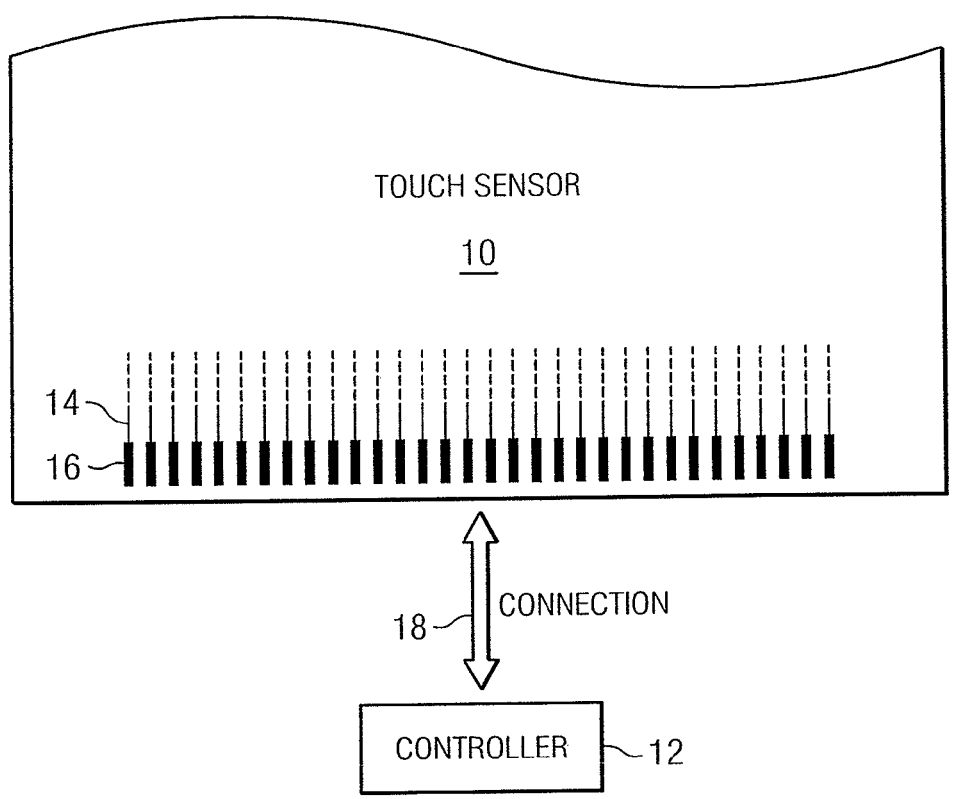
FIG. 1A illustrates an example touch sensor with an example touch-sensor controller.

FIG. 1A illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm); the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10.may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 1B:
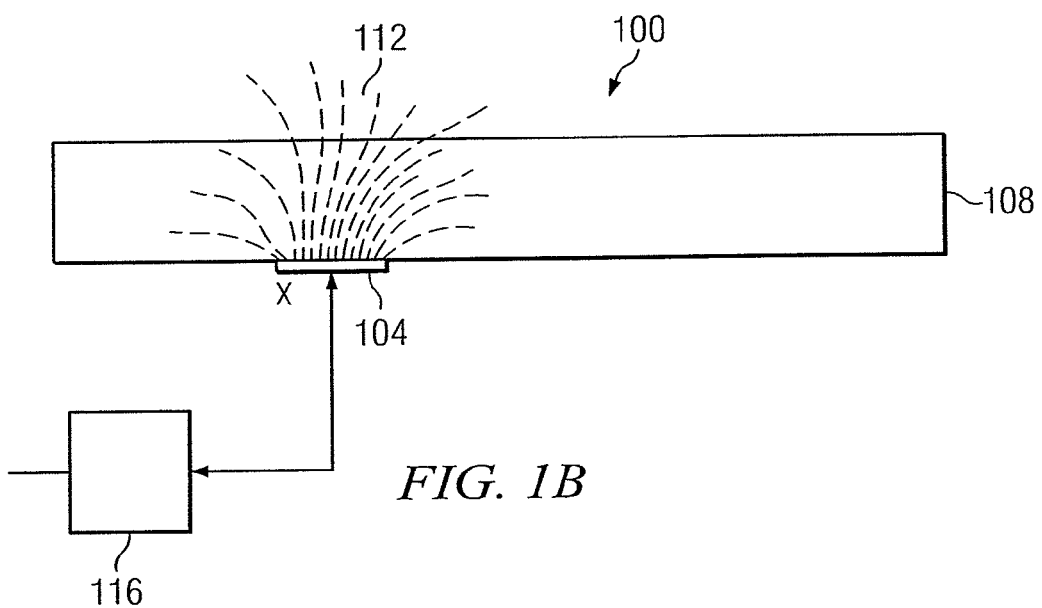
FIG. 1B illustrates a system with a single-layer configuration of electrodes that implement self-capacitive coupling.

FIG. 1B illustrates a system 100 with a single-layer configuration of electrodes that implement self-capacitive coupling. According to the illustrated embodiment, field lines 112 extend from an electrode 104 (e.g. a drive electrode) operated by a circuit 116, the fields penetrating through panel 108. A portion of the emitted field lines 112 escapes into free space or other parts of the panel as shown, and capacitively couples with a finger (not shown) or other object when present. The circuit 116 observes a change in self-capacitance of the capacitive node formed by electrode 104 due to the presence of a finger (or other object) near field lines 112, such as by observing that a greater charge is needed to change the voltage of the capacitive node.

Figure 1C:
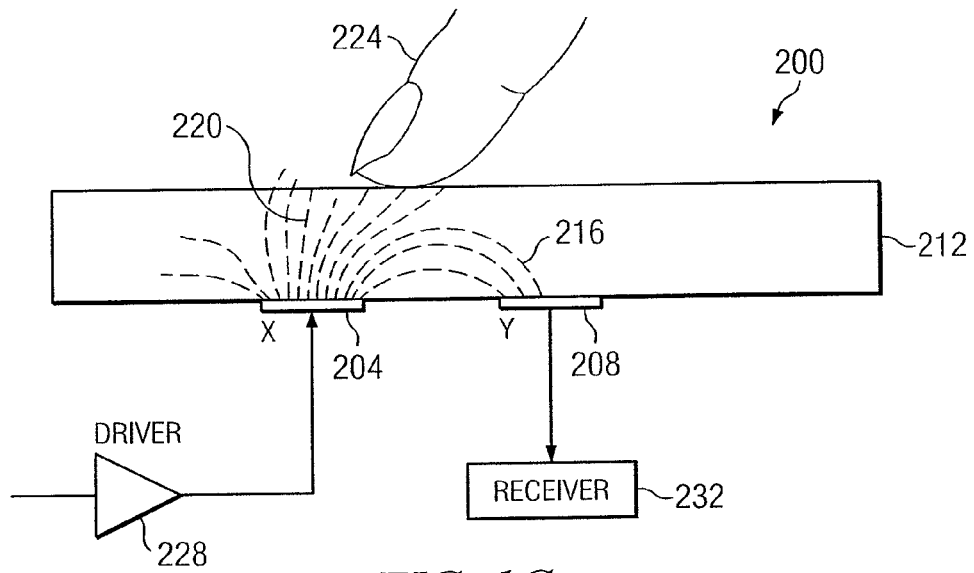
FIG. 1C illustrates a system with a single-layer configuration of electrodes that implement mutual capacitive coupling.

FIG. 1C illustrates a system 200 with a single-layer configuration of electrodes that implement mutual capacitive coupling. According to the illustrated embodiment, a finger 224 causes field lines 216 normally coupling from drive electrode 204 to sense electrode 208 to be absorbed by finger 224, as shown at 220. The result of this action is a very detectable change in capacitance of the capacitive node formed by drive electrode 204 and sense electrode 208. In particular embodiments, the change in capacitance is related to a variety of factors such as fingerprint area, electrode area, panel 212 thickness and dielectric constant, human body size and location, skin thickness and conductivity, and other factors. In particular embodiments, the change in capacitance is sensed by receiver 232.

Figure 1D:
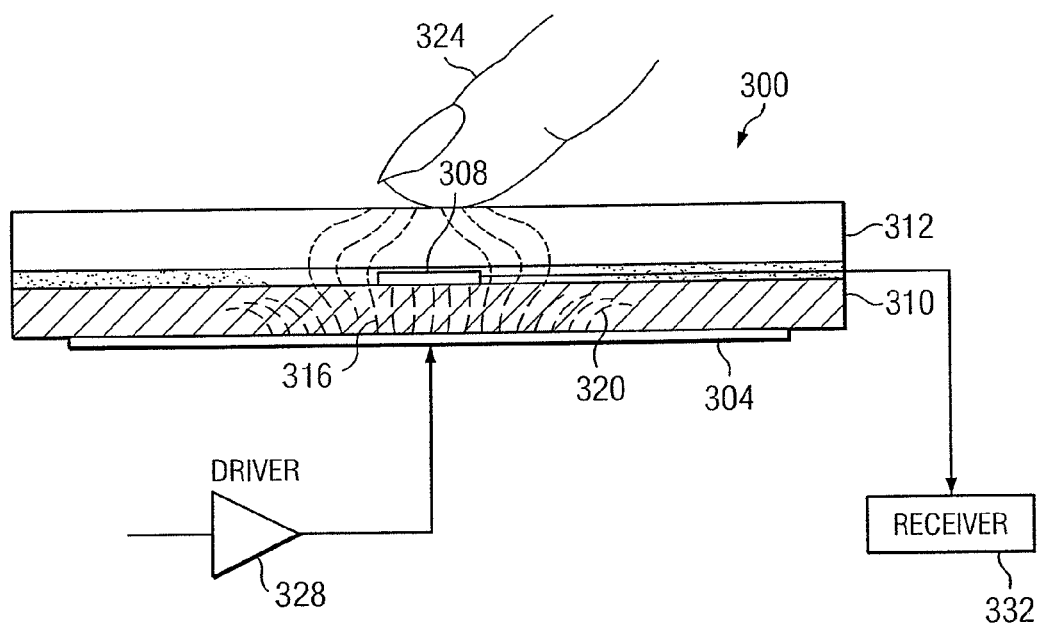
FIG. 1D illustrates a system with a two-layer configuration of electrodes that implement mutual capacitive coupling.

FIG. 1D illustrates a system 300 with a two-layer configuration of electrodes that implement mutual capacitive coupling. According to the illustrated embodiment, a finger 324 causes field lines 316 normally coupling from drive electrode 304 to sense electrode 308 across substrate 310 to be absorbed by finger 324, as shown at 320. The result of this action is a very detectable change in capacitance of the capacitive node formed by drive electrode 304 and sense electrode 308. In particular embodiments, the change in capacitance is related to a variety of factors such as fingerprint area, electrode area, panel 312 thickness and dielectric constant, human body size and location, skin thickness and conductivity, and other factors. In particular embodiments, the change in capacitance is sensed by receiver 332.

Figure 1E:
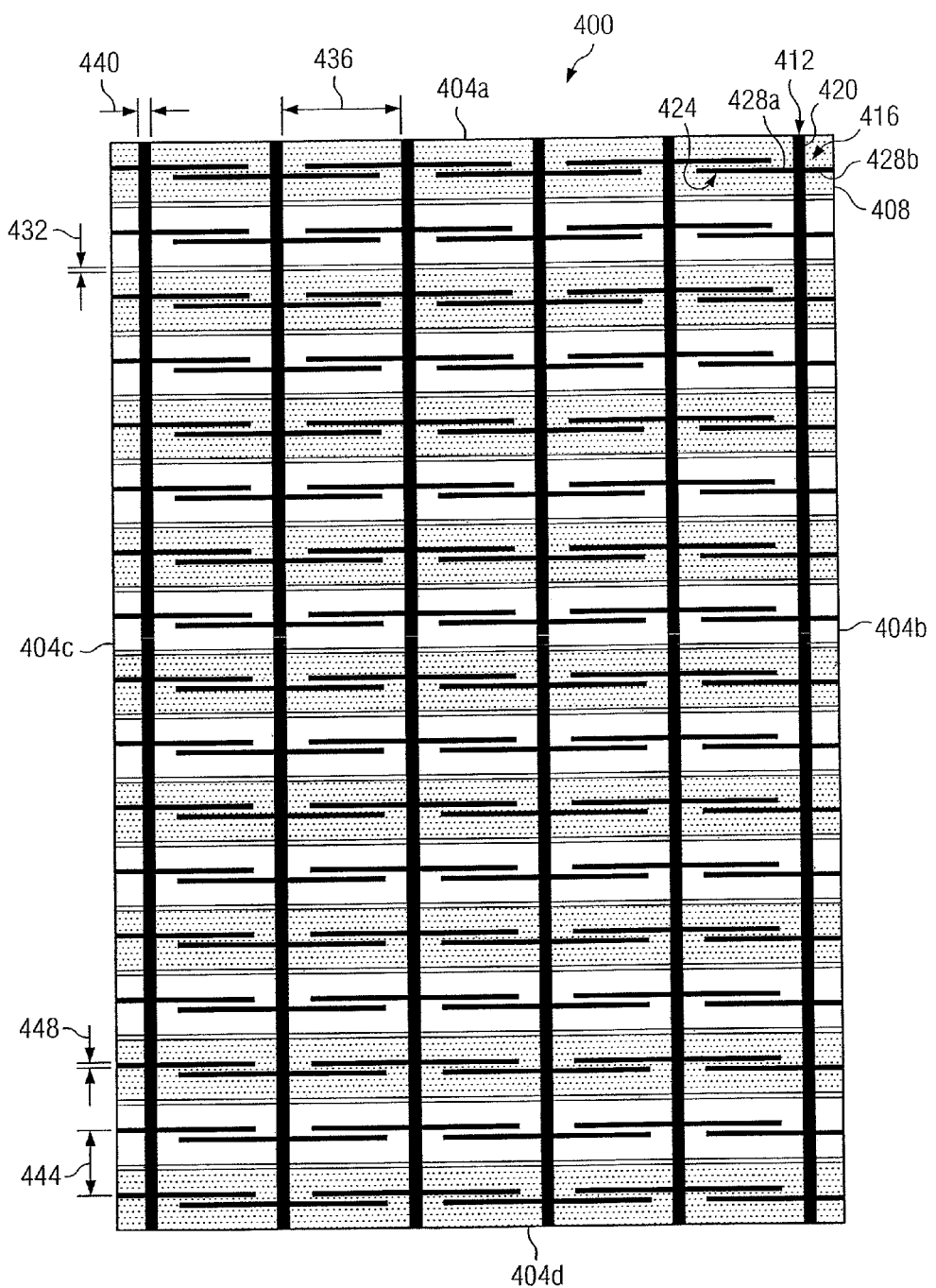
FIGS. 1E-1H illustrate example touch sensors having a two-layer configuration of electrodes that implement mutual capacitance coupling.

FIG. 1E illustrates an example touch sensor 400 having a two-layer configuration of electrodes that implement mutual capacitance coupling. According to the illustrated embodiment, touch sensor 400 includes edges, drive electrodes, and sense electrodes.

Edges (which are illustrated in FIG. 1E as edge 404*a*, edge 404*b*, edge 404*c*, and edge 404*d*) comprise a barrier between the touch-sensitive area of touch sensor 400 and a touchinsensitive area of touch sensor. In particular embodiments, when a user touches (or comes in close proximity to) touch sensor 400 within the edges, the touch (or close proximity) is sensed by touch sensor 400.

Drive electrodes (one of which is illustrated in FIG. 1E as drive electrode 408) and sense electrodes (one of which is illustrated in FIG. 1E as sense electrode 412) are each an area of conductive material forming a shape, such as for example a disc, square, rectangle, other suitable shape, or suitable combination of these. In the illustrated embodiments, drive electrodes are disposed in a pattern on one side of a substrate and sense electrodes are disposed in a pattern on another side of the substrate. In such a configuration, an intersection of a drive electrode and a sense electrode may form a capacitive node (one of which is illustrated as capacitive node 416). Such an intersection may be a location where the drive electrode and the sense electrode "cross" or come nearest each other in their respective planes. The drive and sense electrodes do not make electrical contact with each other—instead they are capacitively coupled to each other across the substrate at the intersection.

According to the illustrated embodiment, each sense electrode includes a spine (one of which is illustrated in FIG. 1E as spine 420) and one or more crossbars (one of which is illustrated in FIG. 1E as crossbar 424). Each crossbar includes two conductive elements (examples of which are illustrated in FIG. 1E as conductive elements 428a and 428b) extending from either side of a spine. In one embodiment, the conductive elements overlap for about 50% of the distance between the spines. Thus, each conductive element extends about 75% of the distance between spines. In particular embodiments, the conductive elements may allow touch sensor 400 to sense a user when the user comes in contact (or comes in close proximity) to an area of touch sensor 400 that is in-between the spines of sense electrodes (such as in-between spine 420 of sense electrode 412 and the spine of the next adjacent sense electrode). In particular, when a user comes in contact (or comes in close proximity) to an area of touch sensor 400 that is in-between the spines of sense electrodes, a reasonable interpolated signal may be generated based on the user coming in contact (or coming in close proximity) to each of the conductive elements of the adjacent sense electrodes (as opposed to the spines themselves).

As illustrated, touch sensor 400 includes a example pattern for the drive electrodes and sense electrodes. According to the illustrated embodiments, the drive electrodes (such as drive electrode 408) are parallel to edge 404a and edge 404d. In particular embodiments, the drive electrodes may be approximately parallel to edge 404a and edge 404d. For example, the drive electrodes may be approximately parallel to edge 404a and edge 404d due to one or more deviations in the shape of edge 404a, edge 404d, and/or the drive electrodes. Furthermore, each adjacent drive electrode may be separated from the next drive electrode by a gap (one of which is illustrated in FIG. 1E as drive electrode gap 432).

In the illustrated embodiment, the spines of the sense electrodes (such as spine 420 of sense electrode 412) are parallel to edge 404b and edge 404c. In particular embodiments, the spines may be approximately parallel to edge 404b and edge 404c. For example, the spines may be approximately parallel to edge 404b and edge 404c due to one or more deviations in the shape of edge 404b, edge 404c, and/or the spine. Furthermore, each spine may be separated from the spine of the next adjacent sense electrode by a gap (one of which is illustrated in FIG. 1E as sense electrode spine gap 436). In particular embodiments, each gap between adjacent spines is identical. For example, each gap may be 6 millimeters (mm). As another example, each gap may be 12 mm. As a further example each gap may be 6 mm-12 mm. As a further example, each gap may be less than 6 mm or greater than 12 mm. Additionally, each spine may have a width (one of which is illustrated in FIG. 1E as sense electrode spine width 440). In particular embodiments, the width of each spine is identical. For example, the width of each spine may be 0.5 mm. As another example, the width of each spine may be 1.5 mm. As a further example, the width of each spine may be 0.5 mm-1.5 mm. As a further example, the width of each spine may be less than 0.5 mm or greater than 1.5 mm.

Figure 1F:
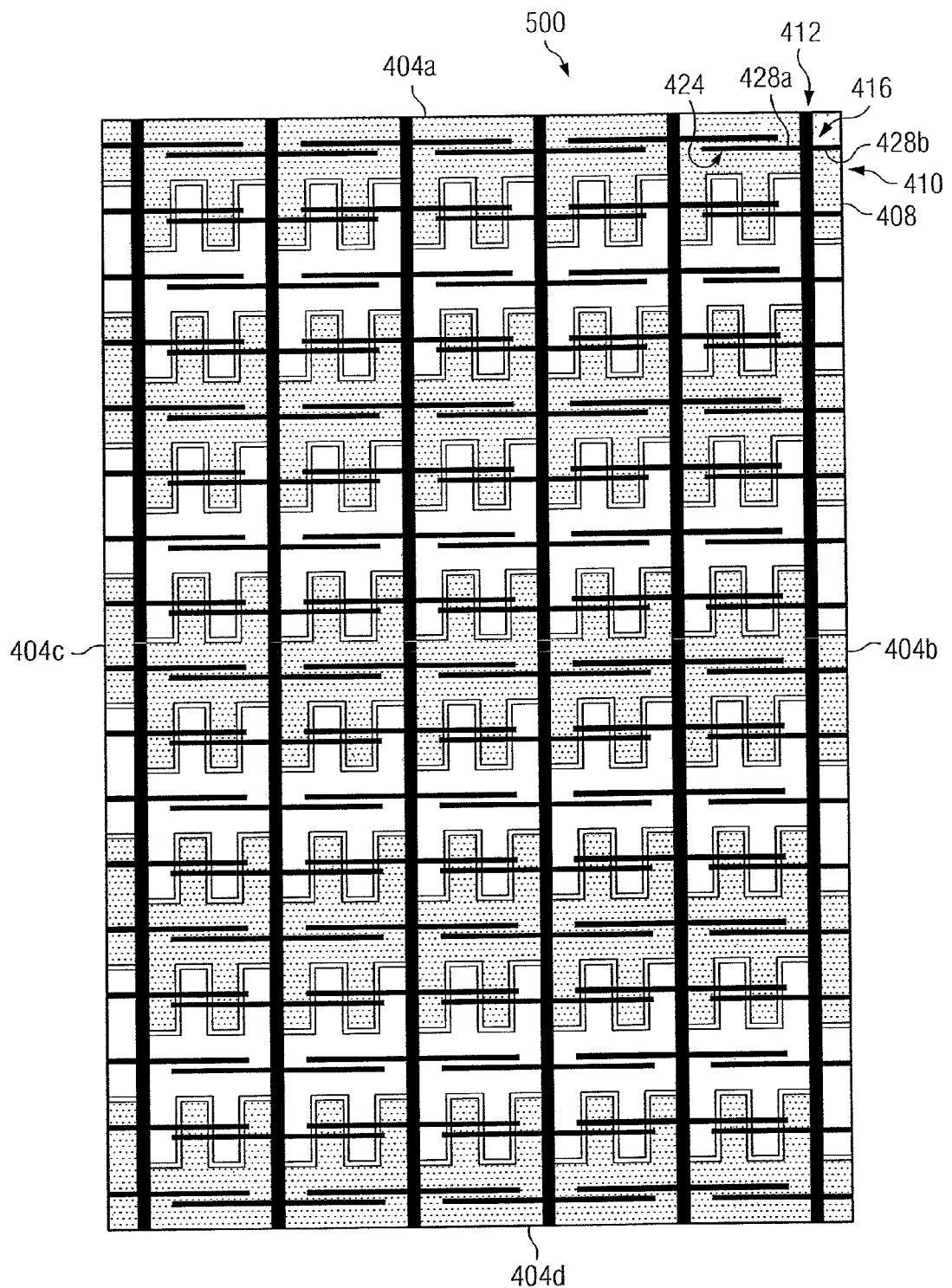

In the illustrated embodiment, the conductive elements of the crossbars of the sense electrodes (such as conductive element 428b of crossbar 424 of sense electrode 412) are parallel to edge 404a and edge 404d. In particular embodiments, the conductive elements may be approximately parallel to edge 404a and edge 404d. For example, the conductive elements may be approximately parallel to edge 404a and edge 404d due to one or more deviations in the shape of edge 404a, 404d, and/or the conductive elements. Furthermore, each conductive element may be separated from the next adjacent conductive element by a gap (one of which is illustrated in FIG. 1E as conductive element gap 444). In particular embodiments, each gap between adjacent conductive elements is identical. For example, each gap may be equal to the pitch of the drive electrodes. In particular, if the pitch of the drive electrodes is 5 mm, each gap between adjacent conductive elements may be 5 mm. As another example, each gap may be approximately equal to the pitch of the drive electrodes. In particular, if the pitch of the drive electrodes is 5 mm, each gap between adjacent conductive elements may be 4.5 mm-5.5 mm. In particular embodiments, if the drive electrodes are interdigitized (as is illustrated in FIG. 1F), each gap may be equal to twice the pitch of the interdigitized drive electrodes. For example, if the pitch of the interdigitized drive electrodes is 2.5 mm, each gap between adjacent conductive elements may be 5 mm. In particular embodiments, if the drive electrodes are interdigitized (as is illustrated in FIG. 1F), each gap may be approximately equal to twice the pitch of the interdigitized drive electrodes. For example, if the pitch of the interdigitized drive electrodes is 5 mm, each gap between adjacent conductive elements may be 4.5 mm-5.5 mm. Additionally, each conductive element may have a width (one of which is illustrated in FIG. 1E as conductive element width 448). In particular embodiments, the width of each conductive element is identical. For example, each width may be 0.3 mm. As another example, each width may be 1 mm. As a further example, each width may be 0.3 mm-1 mm. As a further example, each width may be less than 0.3 mm or greater than 1 mm.

As is discussed above, an intersection of a drive electrode and a sense electrode may form a capacitive node (one of which is illustrated in FIG. 1E as capacitive node 416). Each of these capacitive nodes may have a natural capacitance ($C_x$). According to the illustrated embodiment, the capacitance of each capacitive node in touch sensor 400 may not be the same. For example, the capacitive nodes that are located in the middle of touch sensor 400 may have the same capacitance, but the capacitive nodes along one or more of the edges of touch sensor 400 (such as the capacitive nodes that are closest to edge 404b and/or edge 404c) may not have a capacitance that is the same as that of the other capacitive nodes (such as the capacitive nodes located in the middle of touch sensor 400). In particular, each of the capacitive nodes that are formed by sense electrode 412 (which is the sense electrode that is adjacent to edge 404b) may have a capacitance that is lower than the capacitance of the capacitive nodes that are formed by sense electrodes that are farther away from edge 404b. In particular embodiments, such a lower capacitance also applies to the capacitive nodes that are formed by the sense electrode that is adjacent to the edge opposite of edge 404b (which is illustrated as edge 404c). The capacitive nodes that are closest to the edges (such as the capacitive nodes that are formed by the sense electrodes adjacent to edges 404b and 404c and the capacitive nodes that are formed by drive electrodes adjacent to edges 404a and 404d) may be referred to as "edge capacitive nodes."

In particular embodiments, the edge capacitive nodes (one of which is illustrated in FIG. 1E as capacitive node 416) may have a lower capacitance because the electrode pattern is cut off by the edges of touch sensor 400. As an example, the conductive element that is closest to an edge (such as conductive element 428b of crossbar 424 of sense electrode 412, which is adjacent to edge 404b) may be shorter than the other conductive elements (such as conductive element 428a, or the conductive elements of the crossbars of the sense electrodes that are farther away from edge 404b than sense electrode 412). For example, conductive element 428a may be ⅓ the length of the other conductive elements. Because the conductive element that is closest to the edge is shorter than other conductive elements, the edge capacitive node (such as capacitive node 416) may have less capacitance than other capacitive nodes of touch sensor 400.

In particular embodiments, since some of the capacitive nodes of touch sensor 400 may have a different capacitance than other capacitive nodes of touch sensor 400, the performance of touch sensor 400 may be deficient. For example, the sensitivity of touch sensor 400 may be different at the edge capacitive nodes than at any of the other capacitive nodes. As such, the accuracy of touch sensor 400 may be decreased and/or touch sensor 400 may be non-linear near the edges. In particular embodiments, touch sensor 400 may require one or more different gain settings, which may be detrimental to touch sensor 400. As such, because the capacitance of the edge capacitive nodes is different from that of the other capacitive nodes, touch sensor 400 may be deficient.

In addition, the difference in capacitance between the edge capacitive nodes and other capacitive nodes is not limited to the electrode pattern illustrated in FIG. 1E. In particular, a difference in capacitance between edge capacitive nodes and other capacitive nodes may be found in various electrode patterns in both single-layer configurations and two-layer configurations of touch sensors. For example, FIGS. 1F-1H, described below, provide further examples electrode patterns that result in a difference between the capacitance of edge capacitive nodes and other capacitive nodes.

FIG. 1F illustrates another example touch sensor 500 having a two-layer configuration of electrodes that implement mutual capacitance coupling. In particular embodiments, touch sensor 500 may be an alternative embodiment of touch sensor 400 of FIG. 1E.

According to the illustrated embodiment, touch sensor 500 of FIG. 1F includes the edges, drive electrodes, and sense electrodes described in detail in FIG. 1E. Furthermore, as is illustrated, the drive electrodes of touch sensor 500 of FIG. 1F (one of which is illustrated as drive electrode 408) further include interdigitized drive sections (one of which is illustrated as interdigitized drive section 410). As is illustrated, each of the interdigitized drive sections (or otherwise referred to as "interpolated drive sections") are in-between adjacent drive electrodes. In particular embodiments, the interdigitized drive sections may allow touch sensor 500 to sense a user when the user comes in contact (or comes in close proximity) to an area of touch sensor 500 that is in-between the drive electrodes (such as in-between drive electrode 408 and the next adjacent drive electrode). In particular, when a user comes in contact with (or comes in close proximity to) an area of touch sensor 500 that is in-between the drive electrodes, a reasonable interpolated signal may be generated based on the user coming in contact with (or coming in close proximity to) each of the interdigitized drive sections of the adjacent drive electrodes (as opposed to the drive electrodes themselves).

Similar to FIG. 1E, touch sensor 500 of FIG. 1F also include capacitive nodes that have a capacitance that is different from that of other capacitive nodes. As an example, the capacitance of the capacitive nodes formed by the sense electrodes that are adjacent to edges 404b and 404c may have a capacitance that is less than the capacitance of capacitive nodes formed by the other sense electrodes. In particular embodiments, this capacitance difference may be the result of the conductive elements of the sense electrodes that are adjacent to edges 404b and 404c (such as conductive element 428b of crossbar 424 of sense electrode 412, which is adjacent to edge 404b) being shorter than the other conductive elements (such as conductive element 428a, or the conductive elements of the crossbars of the sense electrodes that are farther away from edge 404b than sense electrode 412).

As another example, the capacitive nodes that are closest to edges 404a and 404d may also have a capacitance that is less than that of capacitive nodes that are located farther away from edges 404a and 404d. In particular embodiments, this difference in capacitance may be the result of the interdigitized drive sections of the drive electrodes of touch sensor 500. For example, according to the illustrated embodiment, each drive electrode includes interdigitized drive sections. However, the drive electrodes that are adjacent to edges 404a and 404d (such as drive electrode 408, which is adjacent to edge 404a) do not have any interdigitized drive sections that face edges 404a and 404d. For example, there is no interdigitized drive sections in-between drive electrode 408 and edge 404a. In certain embodiments, this lack of interdigitized drive sections is the result of the edges 404a and 404d cutting off the electrode pattern. Furthermore, this lack of interdigitized drive sections facing the edges 404a and 404d may result in a lower capacitance at the capacitive nodes that are closest to these edges (e.g., the edge capacitive nodes).

As a further example, the capacitive nodes that are closest to each of the corners of touch sensor 500 (for example, capacitive node 416 is the capacitive node that is closest to the corner created by edge 404a and edge 404b) may also have less capacitance than other capacitive nodes. In particular embodiments, the lower capacitance at these capacitive nodes may be the result of both the shorter conductive elements and the lack of an interdigitized drive section facing the edges. Accordingly, similar to touch sensor 400 of FIG. 1E, touch sensor 500 of FIG. 1F may also be deficient.

Figure 1G:
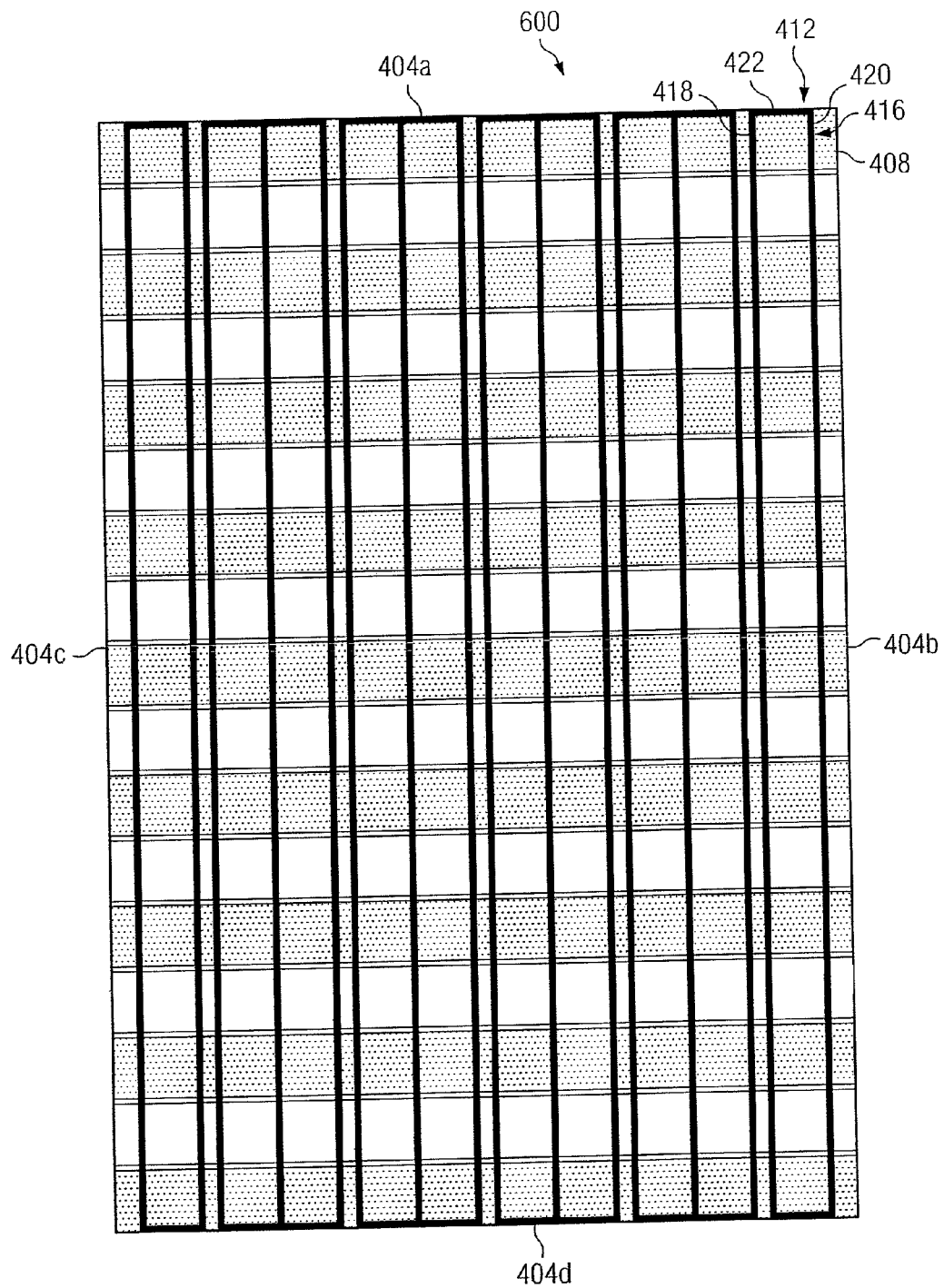
Figure 1H:
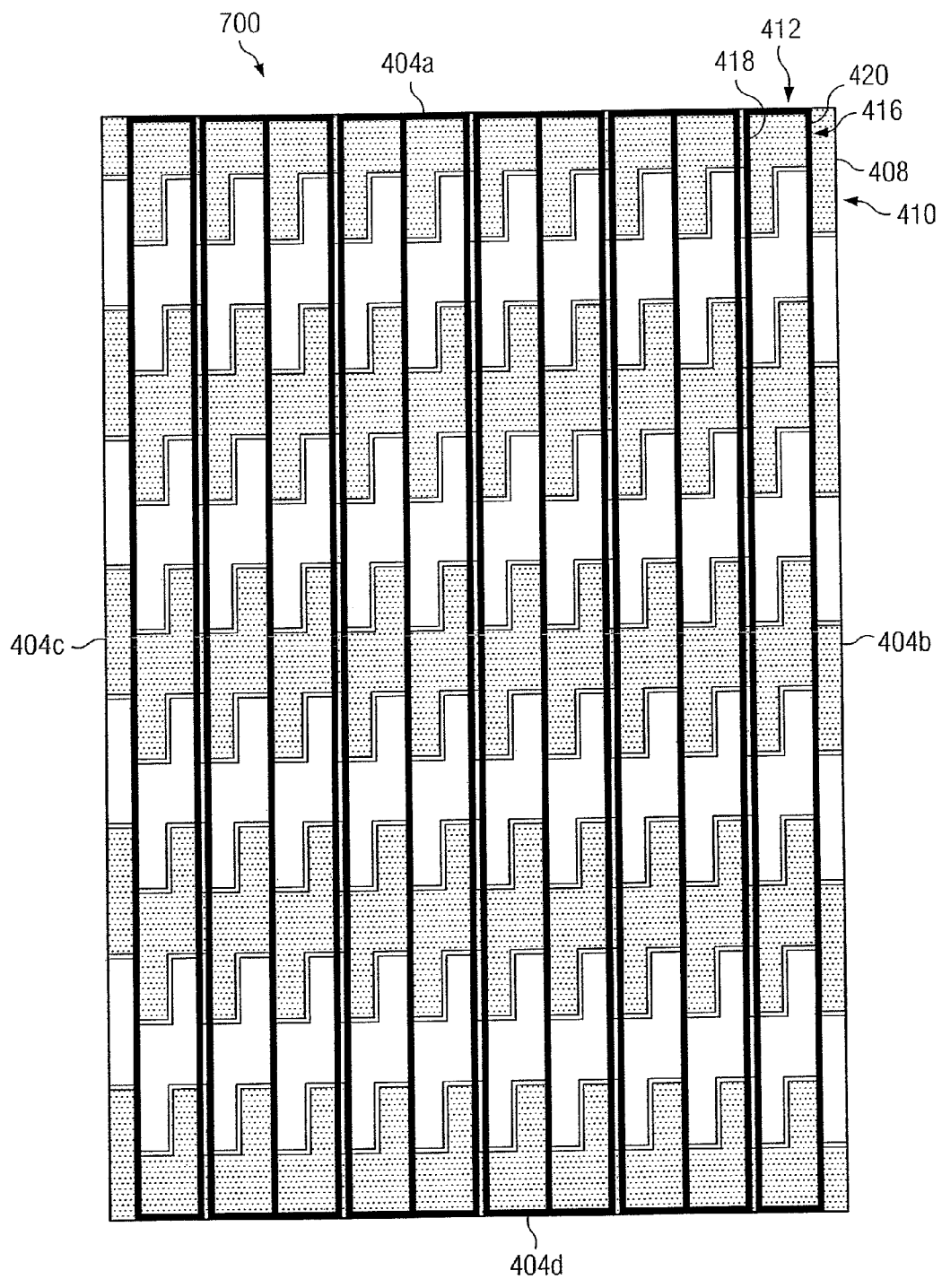

FIGS. 1G-1H illustrate example touch sensors 600 and 700 having a two-layer configuration of electrodes that implement mutual capacitance coupling. In particular embodiments, touch sensors 600 and 700 may be alternative embodiments of touch sensor 400 of FIG. 1E.

According to the illustrated embodiment, touch sensor 600 of FIG. 1G and touch sensor 700 of FIG. 1H includes the edges, drive electrodes, and sense electrodes described in detail in FIG. 1E. The sense electrodes of touch sensor 600 of FIG. 1G and touch sensor 700 of FIG. 1H, however, include a different pattern than that of touch sensor 400 of FIG. 1E. In particular, each sense electrode (one of which is illustrated in FIGS. 1G and 1H as sense electrode 412) includes multiple spines (examples of which are illustrated in FIGS. 1G and 1H as spines 418 and 420). Additionally, although sense electrode 412 only includes two spines (such as spines 418 and 420), each of the sense electrodes that are not adjacent to edges 404b and 404c include three spines. Furthermore, in addition to each sense electrode having multiple spines, the spines of each sense electrode are coupled to each other by spinal elements (one of which is illustrated in FIGS. 1G and 1H as spinal element 422). The sense electrode pattern of FIGS. 1G and 1H may be referred to as a "trident" pattern.

Not only are the sense electrodes of touch sensor 600 of FIG. 1G and touch sensor 700 of FIG. 1H arranged in a trident pattern, but touch sensors 600 of FIG. 1G and touch sensor 700 of FIG. 1H do not include any crossbars. Additionally, similar to FIG. 1E, touch sensor 700 of FIG. 1H (but not touch sensor 600 of FIG. 1G) also includes interdigitized drive sections (one of which is illustrated as interdigitized drive section 410).

Similar to FIGS. 1E and 1F, touch sensor 600 of FIG. 1G and touch sensor 700 of FIG. 1H also include capacitive nodes that have a capacitance that is different from that of other capacitive nodes. As an example, the capacitance of the capacitive nodes formed by the sense electrodes that are adjacent to edges 404b and 404c may have a capacitance that is less than the capacitance of capacitive nodes formed by the other sense electrodes. In particular embodiments, this capacitance difference may be the result of the sense electrodes that are adjacent to edges 404b and 404c only having two spines, as opposed to three spines like the other sense electrodes that are not adjacent to edges 404b and 404c. In particular embodiments, the sense electrodes adjacent to edges 404b and 404c may only have two spines (as opposed to three spines) as a result of edges 404b and 404c cutting off the electrode pattern.

As another example, with regard to touch sensor 700 of FIG. 1H (but not touch sensor 600 of FIG. 1G), the capacitive nodes that are closest to edges 404a and 404d may also have a capacitance that is less than that of capacitive nodes that are located farther away from edges 404a and 404d. In particular embodiments, similar to touch sensor 500 of FIG. 1G, this difference in capacitance may be the result of the interdigitized drive sections of the drive electrodes of touch sensor 700. For example, according to the illustrated embodiment, each drive electrode includes interdigitized drive sections. However, the drive electrodes that are adjacent to edges 404a and 404d (such as drive electrode 408, which is adjacent to edge 404a) do not have any interdigitized drive sections that face edges 404a and 404d. For example, there is no interdigitized drive sections in-between drive electrode 408 and edge 404a. In certain embodiments, this lack of interdigitized drive sections is the result of the edges 404a and 404d cutting off the electrode pattern. Furthermore, this lack of interdigitized drive sections facing the edges 404a and 404d may result in a lower capacitance at the capacitive nodes that are closest to these edges (e.g., the edge capacitive nodes). Accordingly, similar to the touch sensors of FIGS. 1E and 1F, touch sensor 600 of FIG. 1G and touch sensor 700 of FIG. 1H may also be deficient.

In particular embodiments, the deficiencies of touch sensor 400 of FIG. 1E, touch sensor 500 of FIG. 1F, touch sensor 600 of FIG. 1G, touch sensor 700 of FIG. 1H, and any other touch sensor that includes capacitive nodes that have a capacitance that is not approximately the same as that of the other capacitive nodes, may be reduced by a touch sensor that includes capacitive nodes that each have a capacitance that is approximately the same. In particular embodiments, capacitive nodes may each have a capacitance that is approximately the same when each capacitance is within the same operating limits. For example, capacitive nodes may each have a capacitance that is approximately the same when each capacitance is within 0.25 Picofarad (pF), 0.5 pF, 1.0 pF, or 5 pF. As another example, capacitive nodes may each have a capacitance that is approximately the same when each capacitance is within a difference of 10%. In particular embodiments, capacitive nodes may each have a capacitance that is approximately the same when each capacitances is the same. For example, capacitive nodes may each have a capacitance that is approximately the same when each capacitance is equal.

In particular embodiments, capacitive nodes of a touch sensor may each have a capacitance that is approximately the same when each capacitance of the edge capacitive nodes is increased (relative to that of the touch sensors of FIGS. 1E-1H) so as to be approximately the same as that of the other capacitive nodes. In particular embodiments, the capacitances of the edge capacitive nodes may be increased (relative to that of the touch sensors of FIGS. 1E-1H) to be approximately the same as that of the other capacitive nodes in any manner. For example, FIGS. 2A-2G illustrate example electrode patterns of touch sensors that include edge capacitive nodes that each have a capacitance that has been increased so as to be approximately the same as that of the other capacitive nodes.

Figure 2A:
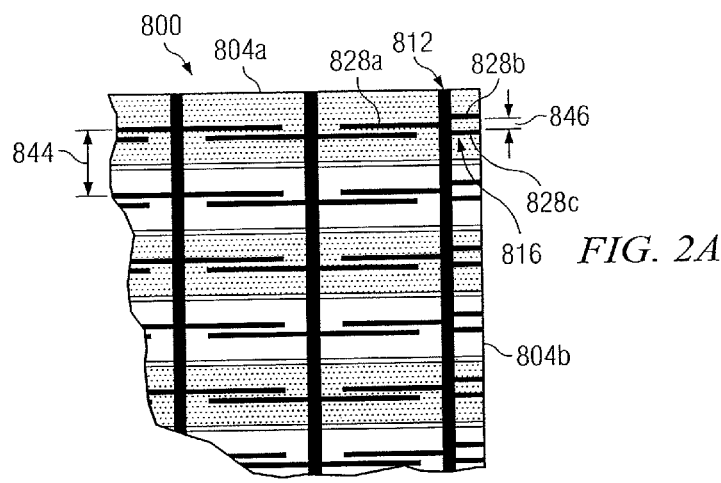
FIGS. 2A-2G illustrate example electrode patterns where each of the capacitive nodes have a capacitance that is approximately the same.

FIG. 2A illustrates an electrode pattern 800 where each of the capacitive nodes have a capacitance that is approximately the same. In particular embodiments, electrode pattern 800 may be used in the touch sensors of FIGS. 1E and 1F.

According to the illustrated embodiment, the capacitance of the edge capacitive nodes may be increased (relative to that of the touch sensors of FIGS. 1E-1F) by adding additional conductive elements (relative to that of the touch sensors of FIGS. 1E-1F) to the sense electrodes that are adjacent to the edges. For example, unlike FIGS. 1E and 1F where sense electrode 412 only includes two conductive elements (conductive elements 428a and 428b) in the proximity of capacitive node 416, in FIG. 2A, sense electrode 812 includes three conductive elements (conductive element 828a, 828b, and 828c) in the proximity of capacitive node 816. In particular embodiments, the additional conductive element may result in the capacitance of capacitive node 816 being increased so as to be approximately the same as that of the other capacitive nodes farther away from edge 804b.

In particular embodiments, the additional conductive element may result in adjacent conductive elements being closer together. For example, a sense electrode that is farther away from edge 804b may have two adjacent conductive elements that are separated by a gap with a first width, as is illustrated by first conductive element gap width 844. Contrary to first conductive element gap width 844, adjacent conductive elements on sense electrode 812 (such as conductive elements 828b and 828c) may be separated by a gap with a second conductive element gap width 846. In particular embodiments, second conductive element gap width 846 is less than first conductive element gap width 844. In particular embodiments, second conductive element gap width 846 may have any size that is less that of first conductive element gap width 844. For example, while first conductive element gap width 844 may be 5 mm, second conductive element gap width 846 may be 0.5 mm-2.5 mm, such as 1 mm. As another example, second conductive element gap width 846 may be less than 0.5 mm or greater than 2.5 mm. In particular embodiments, the size of second conductive element gap width 846 may be adjusted so as to cause the capacitance of capacitive node 816 to be approximately similar to that of other capacitive nodes.

Although FIG. 2A illustrates increasing the capacitance of capacitive node 816 by adding only a single additional conductive element in the proximity of capacitive node 816, in particular embodiments, any number of conductive elements may be added in order to increase the capacitance of capacitive node 816 to be approximately the same as that of the other capacitive nodes of electrode pattern 800 (such as the capacitive nodes formed by sense electrodes that are farther away from edge 804*b*). For example, two or more conductive elements may be added in order to increase the capacitance of capacitive node 816 to be approximately the same as that of the other capacitive nodes of electrode pattern 800. Additionally, the location of each conductive element and the width of the gap between each adjacent conductive element (such as second conductive element gap width 846) may be adjusted in any manner in order to increase the capacitance of capacitive node 816 to be approximately the same as that of the other capacitive nodes of electrode pattern 800. Although FIG. 2A illustrates adding conductive elements in order to increase the capacitance of capacitive node 816, in particular embodiments, conductive elements may be added to increase the capacitance of any (or all) of the edge capacitive nodes.

Figure 2B:
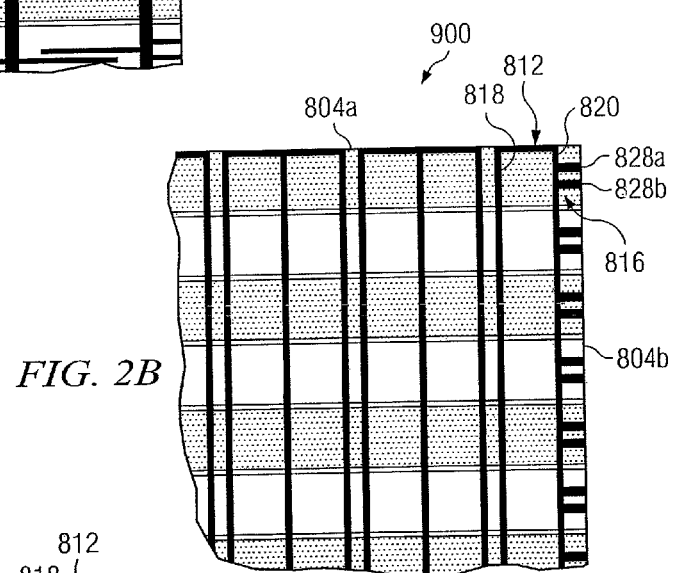
Figure 2C:
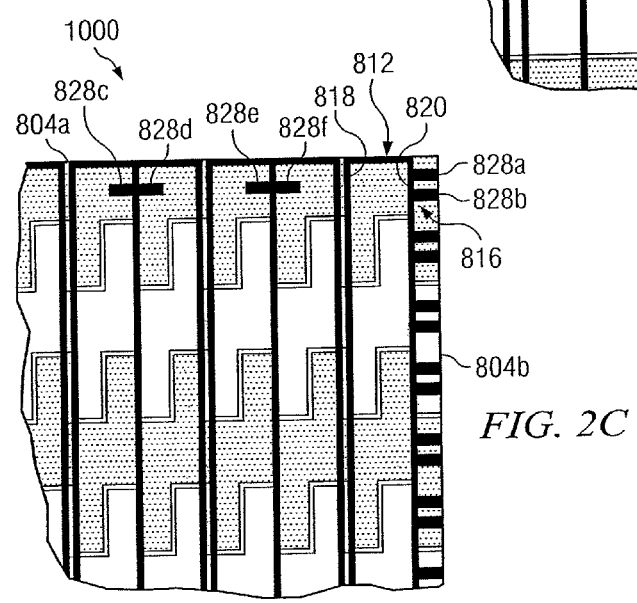

FIGS. 2B and 2C illustrate electrode pattern 900 and electrode pattern 1000 where each of the capacitive nodes have a capacitance that is approximately the same. In particular embodiments, electrode pattern 900 may be used in the touch sensor of FIG. 1G and electrode pattern 1000 may be used in the touch sensor of FIG. 1H.

According to the illustrated embodiments, the capacitance of the edge capacitive nodes may be increased (relative to that of the touch sensor of FIGS. 1G-1H) by adding conductive elements to the sense electrodes that are adjacent to the edges. For example, unlike FIGS. 1G and 1H where sense electrode 412 does not include any conductive elements in the proximity of capacitive node 416, in FIG. 2A, sense electrode 812 includes two conductive elements (conductive element 828*a* and 828*b*) in the proximity of capacitive node 816. In particular embodiments, similar to FIG. 2A, the added conductive elements may result in the capacitance of capacitive node 816 being increased so as to be approximately the same as that of the other capacitive nodes farther away from edge 804*b*.

Furthermore, according to FIG. 2C, the capacitance of the capacitive nodes that are closest to edges 804*a* and 804*d* (not illustrated) may also be increased (relative to that of the touch sensor of FIG. 1H) by adding conductive elements near these capacitive nodes. For example, as is illustrated in FIG. 2C, conductive elements 828*c*, 828*d*, 828*e*, and 828*f* are added to the sense electrodes that are not adjacent to edges 804*b* and 804*c*. These additional conductive elements may increase the capacitance of the capacitive nodes closest to edges 804*a* and 804*d*. As such, despite the fact that a touch sensor may include interdigitized drive sections and sense electrodes in a trident pattern, the capacitive nodes closest to edges 804*a* and 804*d* may be approximately the same as that of the other capacitive nodes in the touch sensor.

Although FIGS. 2B and 2C illustrate increasing the capacitance of capacitive node 816 by adding only two conductive elements in the proximity of capacitive node 816, in particular embodiments, any number of conductive elements may be added in order to increase the capacitance of capacitive node 816 to be approximately the same as that of the other capacitive nodes of electrode patterns 900 and 1000 (such as the capacitive nodes formed by sense electrodes that are farther away from edge 804*b*). For example, three or more conductive elements (or even only one conductive element) may be added in order to increase the capacitance of capacitive node 816 to be approximately the same as that of the other capacitive nodes of electrode patterns 900 and 1000. Additionally, the location of each conductive element and the width of the gap between each adjacent conductive element may be adjusted in any manner in order to increase the capacitance of capacitive node 816 to be approximately the same as that of the other capacitive nodes of electrode patterns 900 and 1000. Although FIG. 2A illustrates adding conductive elements in order to increase the capacitance of capacitive node 816, in particular embodiments, conductive elements may be added to increase the capacitance of any (or all) of the edge capacitive nodes.

Figure 2D:
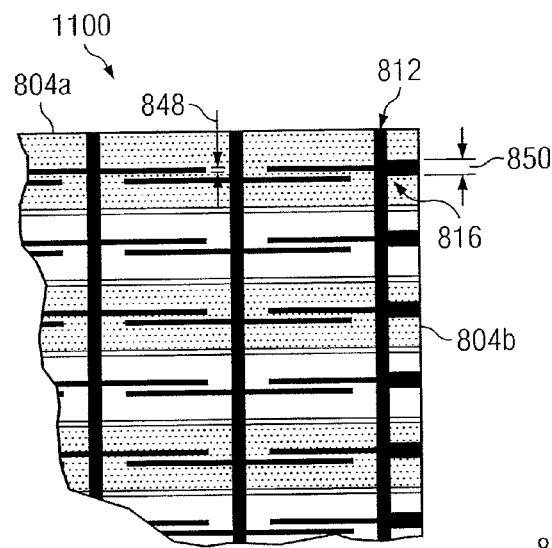

FIG. 2D illustrates an electrode pattern 1100 where each of the capacitive nodes have a capacitance that is approximately the same. In particular embodiments, electrode pattern 1100 may be used in the touch sensors of FIGS. 1E and 1F.

According to the illustrated embodiment, the capacitance of the edge capacitive nodes may be increased (relative to that of the touch sensors of FIGS. 1E-1F) by increasing the width of the conductive elements (relative to that of the touch sensors of FIGS. 1E-1F) of the sense electrodes that are adjacent to the edges. For example, the capacitance of capacitive node 816 may be increased by increasing the width of conductive element 828*b* of sense electrode 812. In particular embodiments, the increased width may result in the capacitance of capacitive node 816 being increased to be approximately the same as that of the other capacitive nodes farther away from edge 804*b*.

In particular embodiments, increasing the width of the conductive elements may include increasing the width of the conductive elements to any size. For example, a sense electrode that is farther away from edge 804*b* may have a conductive element with a first width, as is illustrated by first conductive element width 848. Contrary to first conductive element width 848, one or more of the conductive elements of sense electrode 812 may have a second conductive element width 850. In particular embodiments, second conductive element width 850 is greater than first conductive element width 848. In particular embodiments, second conductive element width 850 may have any size that is greater than that of first conductive element width 848. For example, while first conductive element width 848 may be 0.3 mm-1.0 mm, second conductive element width 850 may be 1.0 mm-2.0 mm. As another example, second conductive element width 850 may be less than 1.0 mm or greater than 2.0 mm. In particular embodiments, the size of second conductive element width 850 may be adjusted so as to cause the capacitance of capacitive node 816 to be approximately the same as that of the other capacitive nodes.

In particular embodiments, adjusting the width of each conductive element may further include adjusting the location of each conductive element. In particular embodiments, the location of each conductive element may be adjusted to any location so as to cause the capacitance of capacitive node 816 to be approximately the same as that of the other capacitive nodes. Although FIG. 2D illustrates increasing the width of a conductive element in order to increase the capacitance of capacitive node 816, in particular embodiments, the width of the conductive elements may be increased in order to increase the capacitance of any (or all) of the edge capacitive nodes.

Figure 2E:
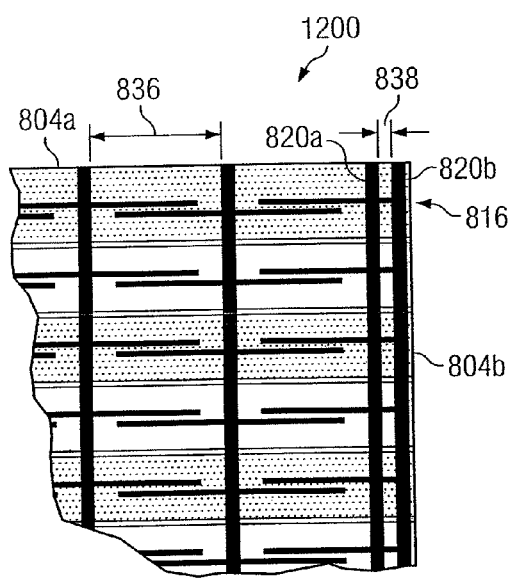

FIG. 2E illustrates an electrode pattern 1200 where each of the capacitive nodes have a capacitance that is approximately the same. In particular embodiments, electrode pattern 1200 may be used in the touch sensors of FIGS. 1E, 1F, 1G, and 1H.

According to the illustrated embodiment, the capacitance of the edge capacitive nodes may be increased (relative to that of the touch sensors of FIGS. 1E-1H) by adding an additional spine (relative to that of the touch sensors of FIGS. 1E-1H) to the sense electrodes that are adjacent to the edges. For example, unlike FIGS. 1E and 1F where sense electrode 412 only includes a single spine 420, in FIG. 2E, sense electrode 812 includes two spines (spine 820*a* and spine 820*b*). In particular embodiments, the additional spine may result in the capacitance of capacitive node 816 being increased to be approximately the same as that of the other capacitive nodes farther away from edge 804*b*.

In particular embodiments, the additional spine may result in adjacent spines being closer together. For example, adjacent spines of sense electrodes that are farther away from edge 804*b* may be separated by a gap with a first width, as is illustrated by first spine gap width 836. Contrary to first spine gap width 836, the two adjacent spines that are closest to the edge (such as spine 820*a* and spine 820*b*) may be separated by a gap with a second spine gap width 838. In particular embodiments, second spine gap width 838 is less than first spine gap width 836. In particular embodiments, second spine gap width 838 may have any size that is less than first spine gap width 836. For example, while first spine gap width 836 may be 6 mm-12 mm, second spine gap width 838 may be 1 mm-5 mm. As another example, second spine gap width 838 may be less than 1 mm or greater than 5 mm. In particular embodiments, the size of second spine gap width 838 may be adjusted so as to cause the capacitance of capacitive node 816 to be approximately the same as that of the other capacitive nodes.

Although FIG. 2E illustrates increasing the capacitance of capacitive node 816 by adding only a single additional spine to sense electrode 812, in particular embodiments, any number of spines may be added in order to increase the capacitance of capacitive node 816 to be approximately the same as that of the other capacitive nodes of electrode pattern 1200 (such as the capacitive nodes formed by sense electrodes that are farther away from edge 804*b*). For example, two or more spines may be added in order in order to increase the capacitance of capacitive node 816 to be approximately the same as that of the other capacitive nodes of electrode pattern 1200. Additionally, the location of each of the spines and the width of the gap between each adjacent spine (such as second spine gap width 838) may be adjusted in any manner in order to increase the capacitance of capacitive node 816 to be approximately the same as that of the other capacitive nodes of electrode pattern 1200. Although FIG. 2E illustrates adding spines in order to increase the capacitance of capacitive node 816, in particular embodiments, spines may be added to increase the capacitance of any (or all) of the edge capacitive nodes.

Figure 2F:
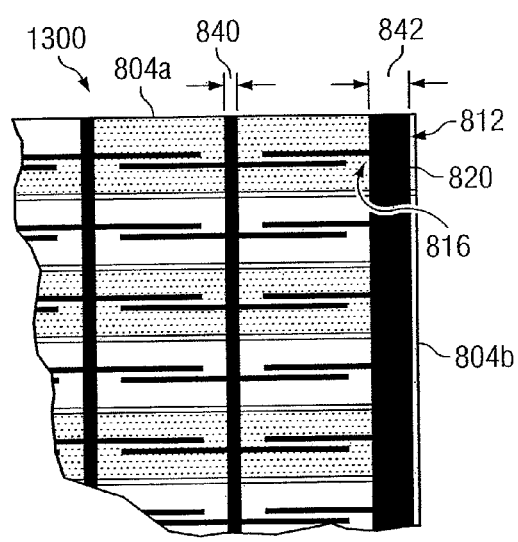

FIG. 2F illustrates an electrode pattern 1300 where each of the capacitive nodes have a capacitance that is approximately the same. In particular embodiments, electrode pattern 1200 may be used in the touch sensors of FIGS. 1E and 1F.

According to the illustrated embodiment, the capacitance of the edge capacitive nodes may be increased (relative to that of the touch sensors of FIGS. 1E-1F) by increasing the width of the spine (relative to that of the touch sensors of FIGS. 1E-1F) of the sense electrodes that are adjacent to the edges. For example, the capacitance of capacitive node 816 may be increased by increasing the width of spine 820 of sense electrode 812. In particular embodiments, the increased width may result in the capacitance of capacitive node 816 being increased to be approximately the same as that of the other capacitive nodes farther away from edge 804*b*.

In particular embodiments, increasing the width of the spines may include increasing the width of the spines to any size. For example, a sense electrode that is farther away from edge 804*b* may have a spine with a first width, as is illustrated by first spine width 840. Contrary to first spine width 840, the spine of sense electrode 812 may have a second spine width 842. In particular embodiments, second spine width 842 is greater than first spine width 840. In particular embodiments, second spine width 842 may have any size that is greater than that of first spine width 840. For example, while first spine width 842 may be 0.5 mm-1.5 mm, second spine width 842 may be 1 mm-2 mm. As another example, second spine width 842 may be less than 1 mm or greater than 2 mm. In particular embodiments, the size of second spine width 842 may be adjusted so as to cause the capacitance of capacitive node 816 to be approximately the same as that of the other capacitive nodes.

In particular embodiments, adjusting the width of a spine may further include adjusting the location of the spine. In particular embodiments, the location of spine 820 may be adjusted to any location so as to cause the capacitance of capacitive node 816 to be approximately the same as that of the other capacitive nodes. Although FIG. 2F illustrates increasing the width of a spine in order to increase the capacitance of capacitive node 816, in particular embodiments, the width of the spines may be increased in order to increase the capacitance of any (or all) of the edge capacitive nodes.

Figure 2G:
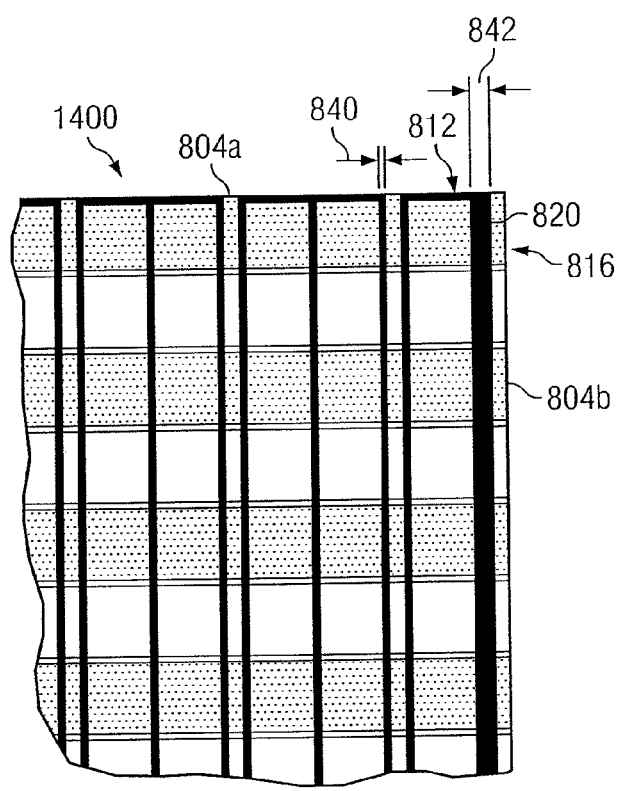

FIG. 2G illustrates an electrode pattern 1400 where each of the capacitive nodes have a capacitance that is approximately the same. In particular embodiments, electrode pattern 1400 may be used in the touch sensors of FIGS. 1G and 1H.

According to the illustrated embodiment, the capacitance of the edge capacitive nodes may be increased (relative to that of the touch sensors of FIGS. 1G-1H) by increasing the width of a spine (relative to that of the touch sensors of FIGS. 1G-1H) of the sense electrodes that are adjacent to the edges. For example, the capacitance of capacitive node 816 may be increased by increasing the width of spine 820 of sense electrode 812. In particular embodiments, the increased width may result in the capacitance of capacitive node 816 being increased to be approximately the same as that of the other capacitive nodes farther away from edge 804*b*.

In particular embodiments, increasing the width of the spines may include increasing the width of the spines to any size. For example, a sense electrode that is farther away from edge 804*b* may have a spine with a first width, as is illustrated by first spine width 840. Contrary to first spine width 840, a spine of sense electrode 812 may have a second spine width 842. In particular embodiments, second spine width 842 is greater than first spine width 840. In particular embodiments, second spine width 842 may have any size that is greater than that of first spine width 840. For example, while first spine width 842 may be 0.5 mm-1.5 mm, second spine width 842 may be 1 mm-2 mm. As another example, second spine width 842 may be less than 1 mm or greater than 2 mm. In particular embodiments, the size of second spine width 842 may be adjusted so as to cause the capacitance of capacitive node 816 to be approximately the same as that of the other capacitive nodes.

In particular embodiments, adjusting the width of a spine may further include adjusting the location of the spine. In particular embodiments, the location of spine 820 may be adjusted to any location so as to cause the capacitance of capacitive node 816 to be approximately the same as that of the other capacitive nodes. Although FIG. 2G illustrates increasing the width of a spine in order to increase the capacitance of capacitive node 816, in particular embodiments, the width of the spines may be increased in order to increase the capacitance of any (or all) of the edge capacitive nodes.

Modifications, additions, or omissions may be made to the electrode patterns of FIGS. 2A-2G without departing from the scope of the disclosure. For example, although each of FIGS. 2A-2G illustrates a particular embodiment for causing the capacitance of each of the capacitive nodes to be approximately the same, in particular embodiments, one or more of the particular embodiments illustrated in FIGS. 2A-2G may be combined in order to cause the capacitance of each of the capacitive nodes to be approximately the same. In particular, additional conductive elements may be added, and the width of the conductive elements may be increased. Furthermore, additional spines may be added, and the width of the spines may be increased. Additionally, any other combination of FIGS. 2A-2G may be used. As another example, although the embodiments of FIGS. 2A-2G have been illustrated as applying to particular touch sensor configurations and particular touch sensor electrode patterns, the embodiments of FIGS. 2A-2G may be applied to any configuration for a touch sensor and any electrode pattern for a touch sensor. For example, the embodiments of FIGS. 2A-2G may be applied to any electrode patterns in both single-layer configurations and two-layer configurations of touch sensors, and may further be applied to any touch sensor that includes capacitive nodes that have a capacitance that is not approximately the same as that of the other capacitive nodes.

Figure 3:
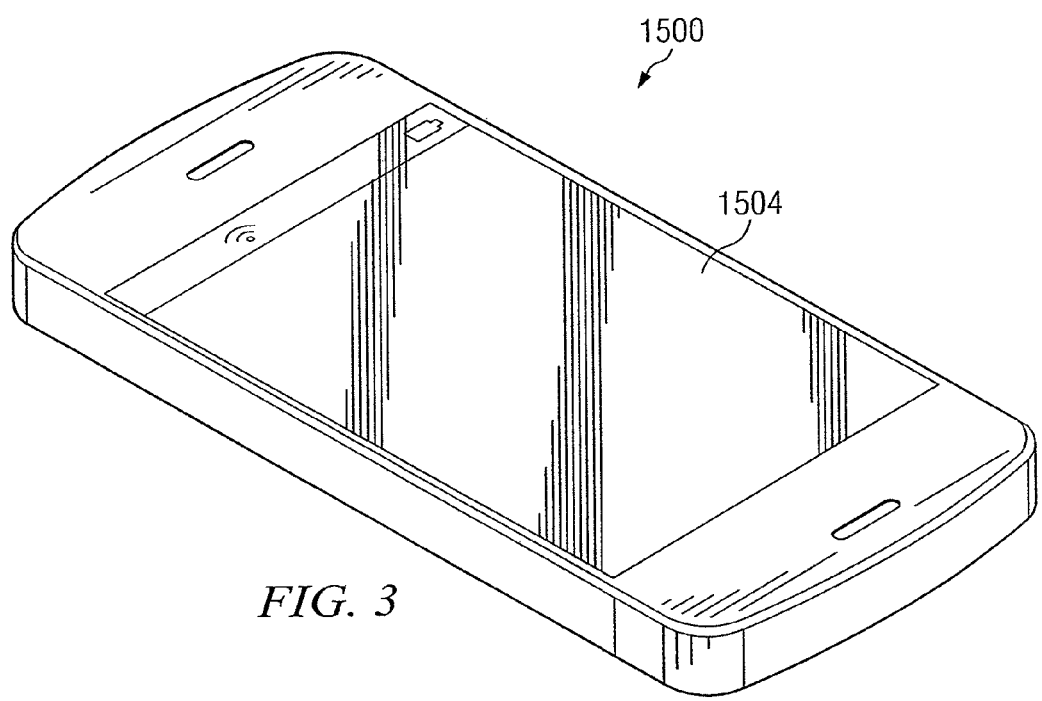
FIG. 3 illustrates a device that may incorporate any of the touch sensors and electrode patterns of FIGS. 1A-2G.

FIG. 3 illustrates a device 1500 that may incorporate any of the touch sensors and electrode patterns of FIGS. 1A-2G. Device 1500 may include a desktop computer, laptop computer, tablet computer, personal digital assistant (PDA), Smartphone, satellite navigation device, telephone, cell phone, portable media player, portable game console, kiosk computer, point-of-sale device, household appliance, automatic teller machine (ATM), any other device, or any combination of the preceding.

According to the illustrated embodiment, device 1500 includes a touch screen display 1504. Touch screen display 1504 enables the touch screen to present a wide variety of data, including a keyboard, a numeric keypad, program or application icons, and various other interfaces as desired. The user may interact with device 1500 by touching touch screen display 1504 with a single finger (or any other object), such as to select a program for execution or to type a letter on a keyboard displayed on the touch screen display 1504. In addition, the user may use multiple touches, such as to zoom in or zoom out when viewing a document or image. In particular embodiments of device 1500, such as home appliances, touch screen display 1504 may not change or may change only slightly during device operation, and may recognize only single touches.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A touch sensor having a first edge and a second edge approximately perpendicular to the first edge, the touch sensor comprising:
    a first plurality of electrodes approximately parallel to the first edge;
    a second plurality of electrodes, each of the second plurality of electrodes having a spine that is approximately parallel to the second edge and a plurality of conductive elements that are approximately parallel to the first edge and in physical contact with the spine, wherein at least one electrode of the second plurality of electrodes is adjacent to the second edge; and
    a plurality of nodes, each node formed by a capacitive coupling between an electrode of the first plurality of electrodes and an electrode of the second plurality of electrodes; and
    wherein the capacitance of each node is approximately the same;
    wherein the plurality of conductive elements of each of the second plurality of electrodes are each separated from each other by a gap;
    wherein one of the gaps of the one electrode of the second plurality of electrodes that is adjacent to the second edge has a width that is less than a width of at least one of the other gaps of the second plurality of electrodes.

2. The touch sensor of claim 1, wherein the capacitance of each node is the same.

3. The touch sensor of claim 1, wherein the spine of the one electrode of the second plurality of electrodes that is adjacent to the second edge has a width that is greater than a width of the spine of at least one of the other electrodes of the second plurality of electrodes.

4. The touch sensor of claim 1, wherein the one electrode of the second plurality of electrodes that is adjacent to the second edge has two spines that are separated from each other by a first gap;
    wherein the spines of the other electrodes of the second plurality of electrodes are each separated from each other by a second gap; and
    wherein the first gap has a width that is less than a width of at least one of the second gaps.

5. The touch sensor of claim 1, wherein at least one of the plurality of conductive elements of the one electrode of the second plurality of electrodes that is adjacent to the second edge has a width that is greater than a width of one of the other conductive elements of the second plurality of electrodes.

6. A touch sensor having a first edge and a second edge approximately perpendicular to the first edge, the touch sensor comprising:
a first plurality of electrodes approximately parallel to the first edge;
a second plurality of electrodes, each of the second plurality of electrodes having a plurality of spines coupled to one another, each of the spines being approximately parallel to the second edge, wherein at least one electrode of the second plurality of electrodes is adjacent to the second edge; and
a plurality of nodes, each node formed by a capacitive coupling between an electrode of the first plurality of electrodes and an electrode of the second plurality of electrodes; and
wherein the capacitance of each node is approximately the same;
wherein at least one of the spines of the one electrode of the second plurality of electrodes that is adjacent to the second edge has one or more conductive elements physically coupled to the spine, wherein each of the conductive elements is approximately parallel to the first edge, wherein none of the conductive elements couple the spines together, wherein at least one of the spines of another electrode of the second plurality of electrodes is devoid of any conductive elements that are approximately parallel to the first edge and that do not couple the at least one of the spines to another spine of the another electrode.

7. The touch sensor of claim 6, wherein the capacitance of each node is the same.

8. The touch sensor of claim 6, wherein the one of the spines of the one electrode of the second plurality of electrodes that is adjacent to the second edge has a width that is greater than a width of a spine at least one of the other electrodes of the second plurality of electrodes.

9. A device, comprising:
a controller; and
a touch sensor having a first edge and a second edge approximately perpendicular to the first edge, the touch sensor coupled to the controller, the touch sensor comprising:
a first plurality of electrodes approximately parallel to the first edge;
a second plurality of electrodes, each of the second plurality of electrodes having a spine that is approximately parallel to the second edge and a plurality of conductive elements that are approximately parallel to the first edge and in physical contact with the spine, wherein at least one electrode of the second plurality of electrodes is adjacent to the second edge; and
a plurality of nodes, each node formed by a capacitive coupling between an electrode of the first plurality of electrodes and an electrode of the second plurality of electrodes; and
wherein the capacitance of each node is approximately the same;
wherein the plurality of conductive elements of each of the second plurality of electrodes are each separated from each other by a gap;
wherein one of the gaps of the one electrode of the second plurality of electrodes that is adjacent to the second edge has a width that is less than a width of at least one of the other gaps of the second plurality of electrodes.

10. The device of claim 9, wherein the capacitance of each node is the same.

11. The device of claim 9, wherein the spine of the one electrode of the second plurality of electrodes that is adjacent to the second edge has a width that is greater than a width of the spine of at least one of the other electrodes of the second plurality of electrodes.

12. The device of claim 9, wherein the one electrode of the second plurality of electrodes that is adjacent to the second edge has two spines that are separated from each other by a first gap;
wherein the spines of the other electrodes of the second plurality of electrodes are each separated from each other by a second gap; and
wherein the first gap has a width that is less than a width of at least one of the second gaps.

13. The device of claim 9, wherein at least one of the plurality of conductive elements of the one electrode of the second plurality of electrodes that is adjacent to the second edge has a width that is greater than a width of one of the other conductive elements of the second plurality of electrodes.

14. A device, comprising:
a controller; and
a touch sensor having a first edge and a second edge approximately perpendicular to the first edge, the touch sensor coupled to the controller, the touch sensor comprising:
a first plurality of electrodes approximately parallel to the first edge;
a second plurality of electrodes, each of the second plurality of electrodes having a plurality of spines coupled to one another, each of the spines being approximately parallel to the second edge, wherein at least one electrode of the second plurality of electrodes is adjacent to the second edge; and
a plurality of nodes, each node formed by a capacitive coupling between an electrode of the first plurality of electrodes and an electrode of the second plurality of electrodes; and
wherein the capacitance of each node is approximately the same;
wherein at least one of the spines of the one electrode of the second plurality of electrodes that is adjacent to the second edge has one or more conductive elements physically coupled to the spine, wherein each of the conductive elements is approximately parallel to the first edge, wherein none of the conductive elements couple the spines together, wherein at least one of the spines of another electrode of the second plurality of electrodes is devoid of any conductive elements that are approximately parallel to the first edge and that do not couple the at least one of the spines to another spine of the another electrode.

15. The device of claim 14, wherein the capacitance of each node is the same.

16. The device of claim 14, wherein the one of the spines of the one electrode of the second plurality of electrodes that is adjacent to the second edge has a width that is greater than a width of a spine at least one of the other electrodes of the second plurality of electrodes.

* * * * *